United States Patent
Höppel

(10) Patent No.: US 8,482,026 B2
(45) Date of Patent: Jul. 9, 2013

(54) OPTOELECTRONIC COMPONENT

(75) Inventor: Lutz Höppel, Alteglofsheim (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/379,417

(22) PCT Filed: Jul. 6, 2010

(86) PCT No.: PCT/EP2010/059638
§ 371 (c)(1),
(2), (4) Date: Jan. 5, 2012

(87) PCT Pub. No.: WO2011/003907
PCT Pub. Date: Jan. 13, 2011

(65) Prior Publication Data
US 2012/0098025 A1  Apr. 26, 2012

(30) Foreign Application Priority Data

Jul. 9, 2009 (DE) .................. 10 2009 032 486

(51) Int. Cl.
| | |
|---|---|
| H01L 29/22 | (2006.01) |
| H01L 33/00 | (2010.01) |
| H01L 27/15 | (2006.01) |
| H01L 29/267 | (2006.01) |
| H01L 31/12 | (2006.01) |
| H01L 31/0203 | (2006.01) |
| H01L 23/04 | (2006.01) |

(52) U.S. Cl.
USPC ............. 257/99; 257/81; 257/433; 257/730; 257/E33.056; 257/E33.057; 257/E33.058; 257/E33.059

(58) Field of Classification Search
USPC ...... 257/81, 99, 433, 730, E33.056, E33.057, 257/E33.058, E33.059
See application file for complete search history.

(56) References Cited

U.S. PATENT DOCUMENTS

| | | | |
|---|---|---|---|
| 5,760,398 A * | 6/1998 | Blackwell et al. | 250/332 |
| 6,445,011 B1 | 9/2002 | Hirano et al. | 257/99 |
| 6,531,328 B1 | 3/2003 | Chen | 438/26 |

(Continued)

FOREIGN PATENT DOCUMENTS

| | | |
|---|---|---|
| DE | 10 2007 022 947 A1 | 10/2008 |
| DE | 10 2008 034 5 | 2/2010 |

(Continued)

OTHER PUBLICATIONS

Abelmann, L. et al., "Oblique Evaporation and Surface Diffusion," Thin Solid Films, 1997, vol. 305, pp. 1-21.

*Primary Examiner* — Ida M Soward
(74) *Attorney, Agent, or Firm* — DLA Piper LLP (US)

(57) ABSTRACT

An optoelectronic component includes a semiconductor body and a carrier substrate connected to the semiconductor body with a solder joint, wherein the carrier substrate includes first and second apertures, through which first and second electrically conductive connecting layers are guided from a first primary surface of the carrier substrate facing away from the semiconductor body to a second primary surface of the carrier substrate facing away from the semiconductor body, the carrier substrate made of a semiconductor material and having side flanks, which run obliquely to the primary surfaces at least in a first partial region, wherein the side flanks are provided with an electrically insulating layer in the first partial region.

15 Claims, 3 Drawing Sheets

U.S. PATENT DOCUMENTS

| | | | |
|---|---|---|---|
| 7,268,371 B2* | 9/2007 | Krames et al. | 257/98 |
| 7,410,908 B2* | 8/2008 | Hara | 438/745 |
| 7,446,344 B2* | 11/2008 | Fehrer et al. | 257/95 |
| 7,738,764 B2* | 6/2010 | Kim | 385/147 |
| 7,977,688 B2* | 7/2011 | Kim | 257/88 |
| 2001/0045619 A1* | 11/2001 | Dekker et al. | 257/566 |
| 2003/0141496 A1* | 7/2003 | Illek et al. | 257/13 |
| 2005/0003565 A1* | 1/2005 | Eisert et al. | 438/22 |
| 2006/0056123 A1 | 3/2006 | Aoyagi et al. | 257/79 |
| 2007/0102654 A1* | 5/2007 | Schoo | 250/576 |
| 2007/0170445 A1* | 7/2007 | Furukawa et al. | 257/94 |
| 2008/0142817 A1 | 6/2008 | Ibbetson et al. | 257/88 |
| 2008/0176353 A1* | 7/2008 | Sugawara et al. | 438/46 |
| 2008/0290353 A1 | 11/2008 | Medendorp, Jr. et al. | 257/89 |
| 2009/0101897 A1 | 4/2009 | Murphy et al. | 257/48 |
| 2009/0173963 A1* | 7/2009 | Hsu et al. | 257/99 |
| 2009/0315048 A1* | 12/2009 | Fehrer et al. | 257/98 |
| 2010/0171135 A1 | 7/2010 | Engl et al. | 257/98 |
| 2011/0211604 A1* | 9/2011 | Roscher | 372/35 |
| 2011/0254046 A1* | 10/2011 | Hsu et al. | 257/99 |

FOREIGN PATENT DOCUMENTS

| | | |
|---|---|---|
| DE | 10 2009 013 0 | 9/2010 |
| EP | 1 020 935 A2 | 7/2000 |
| EP | 1 826 834 A2 | 8/2007 |
| EP | 2 194 588 A2 | 6/2010 |
| WO | 95/22842 A1 | 8/1995 |
| WO | 2005/048363 A2 | 5/2005 |
| WO | 2006/054616 A1 | 5/2006 |
| WO | 2008/131735 A1 | 11/2008 |

* cited by examiner

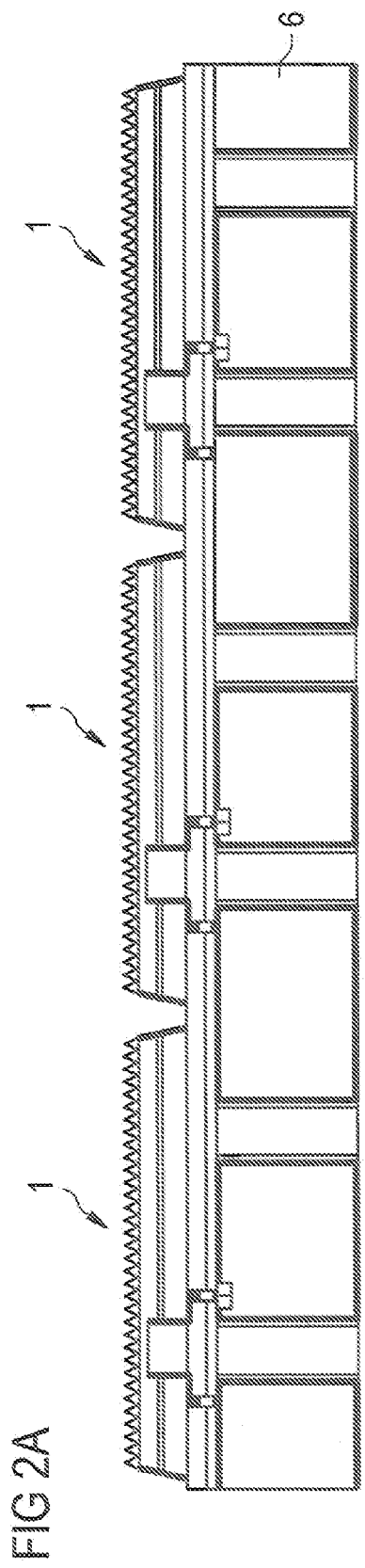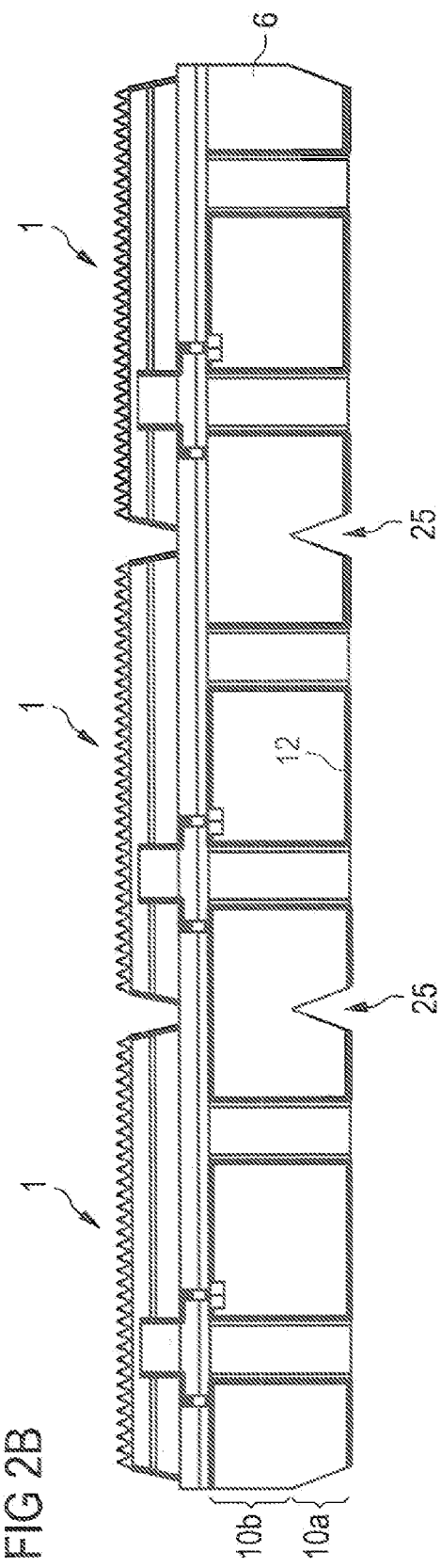

OPTOELECTRONIC COMPONENT

RELATED APPLICATIONS

This is a §371 of International Application No. PCT/EP2010/059638, with an international filing date of Jul. 6, 2010 (WO 2011/003907, published Jan. 13, 2011), which is based on German Patent Application No. 10 2009 032 486.0, filed Jul. 9, 2009, the subject matter of which is incorporated by reference.

TECHNICAL FIELD

This disclosure relates to an optoelectronic component comprising a semiconductor body and a carrier substrate connected to the semiconductor body by a soldering connection.

BACKGROUND

WO 2008/131735 discloses a thin-film light emitting diode chip, wherein a growth substrate for the epitaxial layer sequence of the semiconductor body was detached from the semiconductor body and the semiconductor body is connected to a carrier substrate by a soldering connection, the carrier substrate not being identical to the growth substrate of the epitaxial layer sequence. In the case of this thin-film light emitting diode chip, both electrical contacts are arranged at the rear site of the light emitting diode chip.

It could, however, be helpful to provide an improved optoelectronic component which is surface-mountable and can be connected for example at its underside to the conductor tracks of a printed circuit board, and is simultaneously distinguished by low sensitivity toward short circuits and/or electrostatic discharges (ESD).

SUMMARY

I provide an optoelectronic component including a semiconductor body having an epitaxial layer sequence including an active layer that generates radiation, and a carrier substrate connected to the semiconductor body by a soldering connection, wherein the carrier substrate has a first cutout and a second cutout, through which a first electrically conductive connection layer and a second electrically conductive connection layer are led from a first main area of the carrier substrate, said first main area facing the semiconductor body, to a second main area of the carrier substrate, said second main area being remote from the semiconductor body, the carrier substrate comprises a semiconductor material, the carrier substrate has side flanks which, at least in a first partial region, extend obliquely with respect to the main areas of the carrier substrate, and the side flanks are provided with an electrically insulating layer in the first partial region.

I also provide a method for producing an optoelectronic component including producing a composite assembly composed of a plurality of semiconductor bodies and a semiconductor wafer functioning as a carrier substrate, producing the first partial region of the side flanks in the carrier substrate, wherein the side flanks, in the first partial region, extend obliquely with respect to the main areas of the carrier substrate, applying the electrically insulating layer to the side flanks in the first partial region, and separating the semiconductor wafer to form individual optoelectronic components, wherein the second region of the side flanks is formed during the separating process, said second region not being provided with an electrically insulating layer.

BRIEF DESCRIPTION OF THE DRAWINGS

FIGS. 2A to 2D are schematic illustrations of intermediate steps in an example of a method for producing the optoelectronic component.

DETAILED DESCRIPTION

Figure 1:
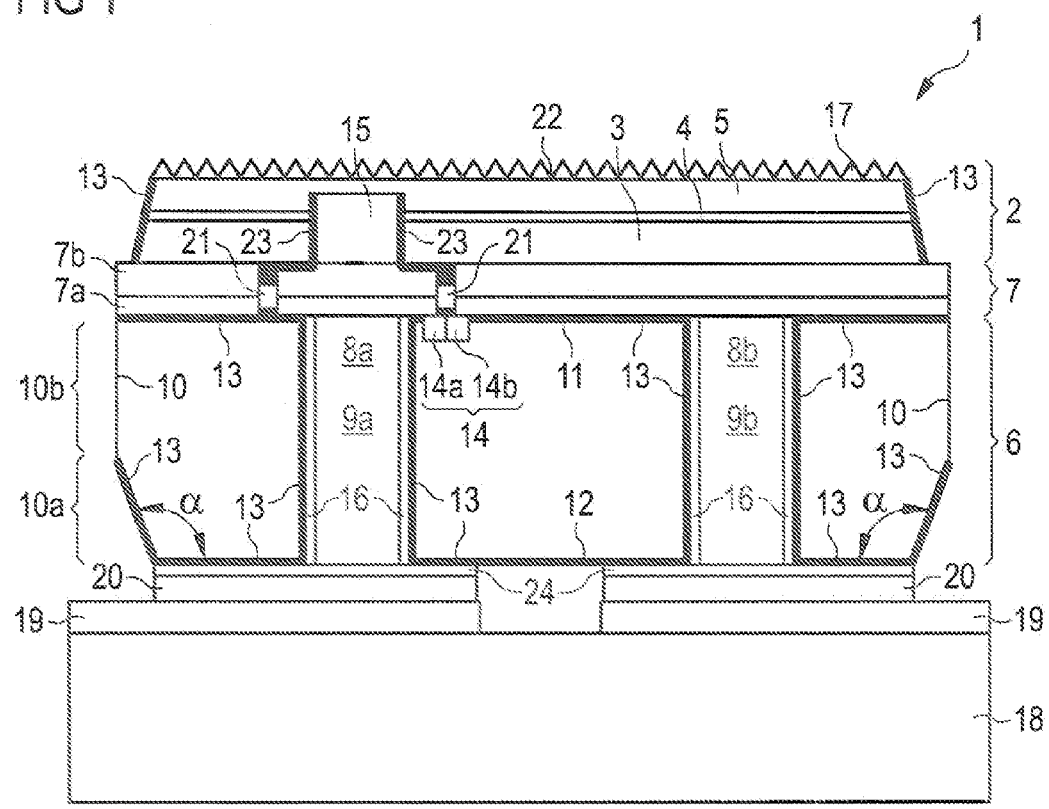
FIG. 1 is a schematic illustration of a cross section through an optoelectronic component in accordance with an example of my component.

My optoelectronic component may comprise a semiconductor body which has an epitaxial layer sequence comprising an active layer suitable for generating radiation. Furthermore, the optoelectronic component comprises a carrier substrate connected to the semiconductor body by a soldering, connection.

The carrier substrate advantageously has a first cutout and a second cutout. A first electrically conductive connection layer is led through the First cutout from a first main area of the carrier substrate, the first main area facing the semiconductor body, to a second main area of the carrier substrate, the second main area being remote from the semiconductor body. Furthermore, a second electrically conductive connection layer is led through the second cutout from a first main area of the carrier substrate, the first main area facing the semiconductor body, to the second main area of the carrier substrate, the second main area being remote from the semiconductor body.

By virtue of the fact that the electrically conductive connection layers are led from the first main area of the carrier substrate, the first main area being connected to the semiconductor body by the soldering connection, to the opposite second main area of the carrier substrate, the optoelectronic component can advantageously be provided with electrical connections at the second main area of the carrier substrate. In particular, the optoelectronic component can be connected to conductor tracks of a printed circuit board at the second main area of the carrier substrate, for example by the first electrically conductive connection layer being connected, by a soldering connection, to a first conductor track of a printed circuit board and the second electrically conductive connection layer being connected, by a second soldering connection, to a second conductor track of the printed circuit board. The optoelectronic component is therefore advantageously surface-mountable.

The carrier substrate of the optoelectronic component is advantageously formed from a semiconductor material, in particular from silicon. A carrier substrate composed of a semiconductor material has the advantage over a carrier substrate composed of a ceramic, for example, that it can be processed comparatively simply and cost-effectively using standardized semiconductor processes.

In accordance with one advantageous configuration, the carrier substrate has side flanks which, at least in a first partial region, extend obliquely with respect to the main areas of the carrier substrate, wherein the side flanks are provided with an electrically insulating layer in the first partial region.

By virtue of the fact that the side flanks of the carrier substrate are at least partly provided with an electrically insulating layer, the risk of short circuits between the first electrically conductive connection layer and the second electrically conductive connection layer is reduced. The risk of a short circuit exists, in particular, when the first electrically conductive connection layer and the second electrically conductive connection layer are connected, for example, to the conductor tracks of a printed circuit board by a soldering connection. In this case, it is possible for the solder to rise up to the side flanks of the carrier substrate during the soldering process, with the result that a short circuit can occur in the case of a carrier substrate composed of a semiconductor material on account of the at least low conductivity of the semiconductor material. This risk is reduced by the electrically insulating layer applied to the first partial region of the side flanks.

The first partial region of the side flanks to which the electrically insulating layer is applied preferably adjoins the second main area of the carrier substrate. The second main area of the carrier substrate, the second main area lying opposite the semiconductor body, can be provided, in particular, for mounting the optoelectronic component onto a printed circuit board such that the risk of a short circuit as a result of solder rising up to the side flank is increased in that region of the side flanks which adjoins the second main area. Therefore, it is advantageous if at least that partial region of the side flanks of the carrier substrate adjoining the second main area is provided with an electrically insulating layer.

The height of the first partial region in which the side flanks extend obliquely with the main areas of the carrier body and are provided with an electrically insulating layer is preferably between 10% and 50% inclusive of the height of the carrier substrate. In this case, the height of the obliquely extending side flanks should be understood to mean the projection of the side flanks onto the direction perpendicular to the main areas of the carrier substrate. The first partial region of the side flanks advantageously has a height of between 20 µm and 100 µm. By way of example, the first partial region can have a height of approximately 30 µm.

The carrier substrate of the optoelectronic component can be a silicon substrate, in particular. A silicon substrate has the advantage that it is cost-effective, can be processed comparatively simply, for example during the production of the cutouts for the two electrical connection layers.

The electrically insulating layer applied, in particular, to the first partial region of the side flanks preferably contains a silicon oxide or a silicon nitride. A silicon oxide layer can advantageously be produced on a silicon substrate by means of thermal oxidation. Furthermore, a silicon oxide layer or a silicon nitride layer can also be applied to the semiconductor substrate by means of a (ND method or by means of a spin-on technique.

Preferably, the side flanks of the carrier substrate, in the first partial region, extend obliquely with respect to the main areas of the carrier substrate such that a cross section of the carrier substrate tapers toward the second main area. The fact that the side flanks of the carrier substrate extend obliquely in the first partial region facilitates the coating of the side flanks in the first partial region. In particular, the side flanks extending obliquely with respect to the second main area can be coated more easily than if they in each case extended perpendicularly to the second main area and thus formed surfaces facing away from one another.

It is particularly advantageous if the side flanks, in the first partial region, extend at an obtuse angle of between 100° and 135° inclusive with respect to the second main area of the carrier substrate.

Advantageously, the side flanks can have a second partial region adjoining the first main area of the carrier substrate, the second partial region extending perpendicularly to the first main area. The second partial region of the side flanks which extends perpendicularly to the first main area of the carrier substrate can arise during production of the optoelectronic component in particular by virtue of the flirt that a semiconductor wafer serving as a carrier substrate for a multiplicity of semiconductor bodies is singulated to form individual optoelectronic components. In particular, during production of the optoelectronic component, first, a multiplicity of semiconductor bodies can be connected to a carrier substrate, wherein the production of the oblique side flanks and the coating of the oblique side flanks are effected whilst still in the wafer stage, that is to say before the semiconductor wafer is separated to form individual optoelectronic components. The second partial region having the perpendicular side flanks arises when the semiconductor wafer is separated to form individual optoelectronic components.

The second partial regions of the side flanks need not necessarily be provided with an insulating layer since the risk of a short circuit primarily occurs in the first partial regions of the side flanks adjoining the second main area, which are provided with an insulating layer before the semiconductor wafer is singulated to form individual optoelectronic components. The coating process can therefore be effected in the wafer assemblage simultaneously for a multiplicity of optoelectronic components, wherein further coating processes no longer have to be carried out after the semiconductor wafer has been separated into individual carrier substrates for optoelectronic components.

Further advantageously, the carrier substrate may have, at a main area, a doping zone that forms a protective diode between the electrically conductive connection layers. The protective diode advantageously protects the optoelectronic component against damage caused by electrostatic discharges (ESD).

The protective diode can be embodied, in particular, in such that the carrier substrate is undoped and the doping zone has a p-doped region and an n-doped region, wherein the first electrically conductive connection layer is electrically conductively connected to the p-doped region of the doping zone and the second electrically conductive connection layer is electrically conductively connected to the n-doped region of the doping zone. The p-doped region and the n-doped region of the doping zone can respectively be produced by ion implantation of a p-type or n-type dopant into the carrier substrate. In the case of a semiconductor substrate composed of silicon, by way of example, B can be used as a p-type dopant for producing the p-doped region and P can be used as an n-type dopant for producing the n-doped region of the protective diode.

The epitaxial layer sequence of the semiconductor body preferably has a p-doped semiconductor region and an n-doped semiconductor region, wherein the first electrically conductive connection layer is electrically conductively connected to the n-doped semiconductor region and the second electrically conductive connection layer is electrically conductively connected to the p-doped semiconductor region.

By virtue of the fact that the first electrically conductive connection layer is electrically conductively connected to the p-doped region of the doping zone and the second electrically conductive connection layer is electrically conductively connected to the n-doped region of the doping zone, the doping zone forms a protective diode that is reverse-connected in parallel with the pn junction of the epitaxial layer sequence of the optoelectronic component. The protective diode is therefore electrically conducting if an electrical voltage is present in the reverse direction of the pn junction of the optoelectronic component, for example as a result of electrostatic charges, in this case, the voltage decreases as a result of a current flow through the protective diode. In this way, the pn junction of the optoelectronic component is protected against destruction by excessively high voltages in the reverse direction.

Preferably, the doping zone is arranged at the first main area of the carrier substrate, the first main area facing the semiconductor body. The doping zone is preferably embodied such that the p-doped partial region and the n-doped partial region adjoin one another and are arranged alongside one another in a direction parallel to the main area of the carrier substrate. To connect the p-doped partial region of the doping zone to the first electrically conductive connection layer and the n-doped partial region to the second electrically conductive connection layer, the doping zone need not necessarily extend as to as the cutouts in the carrier substrate. Rather, the doping zone at the first main area of the carrier substrate can advantageously adjoin a solder layer that electrically conductively connects the first electrically conductive connection layer to an n-type contact of the semiconductor body, and the n-doped partial region of the doping zone can adjoin a solder layer that electrically conductively connects the second electrically conducive connection layer to a p-type contact of the semiconductor body.

Further advantageously, the epitaxial layer sequence of the optoelectronic component may have no growth substrate. Therefore, a so-called "thin-film light emitting diode chip" is involved, wherein the growth substrate used for the growth of the epitaxial layer sequence was detached after the connection of the semiconductor body to the carrier substrate.

In a method for producing the optoelectronic component, a first step involves producing a composite assembly composed of a plurality of semiconductor bodies and a semiconductor wafer functioning as a carrier substrate. Afterward, the first partial regions of the side flanks are produced in the carrier substrate, wherein the side flanks, in the first partial region, in each case extend obliquely with respect to the main areas of the carrier substrate. In a further step, an electrically insulating layer is applied to the side flanks in the first partial region. Afterward, the semiconductor wafer is separated to form individual optoelectronic components, wherein a second region of the side flanks is formed during the separating process, said second region not being provided with an electrically insulating layer.

Our components and methods are explained in greater detail below on the basis of examples in connection with FIGS. 1 and 2.

The constituent parts illustrated in the figures and the size relationships of the constituent parts among one another should not be regarded as true to scale.

The example of an optoelectronic component as illustrated in FIG. 1 concerns an LED. The LED has a semiconductor body 1, which has an epitaxial layer sequence 2 comprising an active layer 4 suitable for emitting radiation. The active layer 4 can have, for example, a pn junction or a single or multiple quantum well structure for generating radiation. The active layer 4 is arranged between a p-doped semiconductor region 3 and an n-doped semiconductor region 5, The side flanks of the semiconductor body 1 are advantageously provided with an insulating layer 13.

The semiconductor body I can be roughened or provided with a structuring 17 at its radiation exit area 22 to improve the coupling-out of radiation from the semiconductor body 1. The structuring or roughening of the semiconductor body at the radiation exit area 22 can be effected by an etching process, in particular.

The LED in accordance with the example is a so-called "thin-film LED," from which a growth substrate used for the growth of the epitaxial layer sequence 2 was subsequently detached from the epitaxial layer sequence 2. The original growth substrate was detached from that side of the semiconductor body 1 at which the radiation exit area 22 is now situated.

At a surface lying, opposite the radiation exit area 22, the semiconductor body 1 is connected to a carrier substrate 6 by a soldering connection 7. The connection of the semiconductor body 1 to the carrier substrate 6 is effected during production of the component preferably before the original growth substrate is detached from that surface of the semiconductor body 1 which now serves as radiation exit area 22. Since the carrier substrate 6, in contrast to the growth substrate, does not have to be suitable for the epitaxial growth of the epitaxial layer sequence 2, which is based for example on a nitride compound semiconductor material, there is a comparatively great freedom in material selection for the carrier substrate. In particular, it is possible to select a carrier substrate which is distinguished by comparatively low costs and/or a good thermal conductivity.

The soldering connection 7 can be formed, for example, from a solder layer 7a applied to the earner substrate and which can be an Au layer, in particular, and a solder layer 7b, applied to the semiconductor body 1 and which can be an AuSn layer, in particular. The solder layer 7a applied to the carrier substrate 6 and the solder layer 7b applied to the semiconductor body 1 can fuse together to the greatest possible extent during the production of the soldering connection 7 and, therefore, need no longer be discernible as individual layers in the optoelectronic component.

The carrier substrate 6 has a first main area 11 facing the semiconductor body 1, and a second main area 12 facing away from the semiconductor body. A first cutout 8a is formed in the carrier substrate 6, through which cutout a first electrically conductive connection layer 9a is led from the first main area 11 to the second main area 12 of the carrier substrate 6. Furthermore, a second cutout 8b is formed in the carrier substrate 6, through which cutout a second electrically conductive connection layer 9b is led from the first main area 11 to the second main area 12 of the carrier substrate 6. The electrically conductive connection layers 9a, 9b can contain Au or CuW, for example.

The carrier substrate 6 is formed from a semiconductor material. In particular, the carrier substrate 6 can be a silicon substrate. The use of a carrier substrate 6 composed of a semiconductor material such as silicon, for example, has the advantage that the carrier substrate 6 is comparatively cost-effective and can be processed comparatively simply by standardized semiconductor processes.

To avoid short circuits in the optoelectronic component, the first main area 11 and the second main area 12 of the carrier substrate 6, apart from the cutouts 8a, 8b filled with the connection layers 9a, 9b, are provided with an electrically insulating layer 13. To insulate the semiconductor material of the carrier substrate 6 from the connection layers 9a, 9b, the inner walls of the cutouts 8a, 8b are also in each case provided with the electrically insulating layer 13.

Production of the electrically conductive connection layers 9a, 9b in the cutouts 8a, 8b of the carrier substrate 6 can be effected, for example, such that, first, metallization layers 16, for example Au metalizations, are applied to the inner walls of the cutouts 8a, 8b that are provided with the insulating layer 13. The connection layers 9a, 9b are then produced in the cutouts 8a, 8b galvanically, for example, wherein the metalizations 16 serve as seed layers, Further advantageously, the method for producing the connection layers 9a, 9b may consist of pressing the solder as liquid metal into the cutouts 8a, 8b (liquid solder fill). This process is simpler and fast than a plating process.

The two electrically conductive connection layers 9a, 9b serve for making electrical contact with the semiconductor body 1. By way of example, the first electrically conductive connection layer 9a is electrically conductively connected to the n-doped semiconductor region 5 of the epitaxial layer sequence 2 and the second electrically conductive connection layer 9b is electrically conductively connected to the p-doped semiconductor region 3.

An electrically conductive connection between the second electrically conductive connection layer 9b and the p-doped region 3 of the epitaxial layer sequence 2 can be effected by the soldering connection 7 arranged between the semiconductor body 1 and the carrier substrate 6. In particular, the second electrically conductive connection layer 9b adjoins a region of the soldering connection 7 which is electrically connected to the p-doped semiconductor region 3. The p-doped semiconductor region 3 need not necessarily directly adjoin the soldering connection 7, as illustrated in FIG. 1. Rather, further layers can be arranged between the p-doped semiconductor region 3 and the soldering connection 7, in particular a mirror layer (not illustrated), which deflects radiation emitted from the active layer 4 in the direction of the carrier substrate to the radiation exit area 22. In addition to the mirror layer, even further layers can also he arranged between the p-doped semiconductor region 3 and the soldering connection 7, for example barrier, wetting or adhesion promoter layers, which, by way of example, prevent diffusion of the solder material of the soldering connection 7 into the mirror layer or improve the wetting of the semiconductor body 1 with the solder material.

The first electrically conductive connection layer 9a is advantageously electrically conductively connected to the n-doped semiconductor region 5. This can be effected, for example, such that a partial region of the soldering connection 7 is insulated from the rest of the soldering connection 7 and from the p-doped semiconductor region 3 by insulating layers 23. A through contact 15 is led from this region of the soldering connection 7 through a cutout through the epitaxial layer sequence 2 right into the n-doped semiconductor region 5. The through contact 15 is insulated from the p-doped semiconductor region 3 and the active layer 4 by an insulating layer 23. The insulating layer 23 can have two cavities 21 in the region of the soldering connection 7, which cavities can arise by virtue of the fact that the solder layer 7b applied to the semiconductor body 1 to produce the soldering connection 7 and the solder layer 7a applied to the carrier substrate 6 are thicker than the insulating layer 23 respectively applied to the semiconductor body 1 and the carrier substrate 6.

The contact-connection of the optoelectronic component by a through contact 15 led through the active zone 4 has the advantage that both the contact-connection of the n-doped semiconductor region 5 and that of the p-doped semiconductor region 3 are effected from that side of the semiconductor body 1 which faces the carrier substrate 6. The radiation exit area 22 of the optoelectronic component is therefore advantageously free of electrical contact elements such as, for example, bonding pads, contact metalizations or connection wires. Absorption of radiation by contact elements at the radiation exit area 22 is prevented in this way.

At the second main area 12 of the carrier substrate 6, the second main area lying opposite the semiconductor body 1, the electrically conductive connection layers 9a, 9b led through the cutouts 8a, 8b can advantageously be connected externally. In particular, the electrically conductive connection layers 9a, 9b can be connected to the conductor tracks 19 of a printed circuit board 18, for example, at the second main area of the carrier substrate 6. The electrically conductive connection layers 9a, 9b can, for example, at the second main area 12 of the carrier substrate 6, in each case be provided with a metalization layer 24, for example a nickel layer, which is in each case connected to the conductor tracks 19 of the printed circuit board 18 by a solder layer 20. The optoelectronic component is therefore advantageously surface-mountable.

By virtue of the fact that the optoelectronic component has a carrier substrate 6 composed of a semiconductor material and two connection contacts at its second main area lying opposite the semiconductor body 1, a short circuit could arise between the two electrically conductive connection layers 9a, 9b or the conductor tracks 19 of the printed circuit board 18 if a current were conducted via the side flanks 10 of the carrier substrate 6. This would he the case particularly if the solder layer 20 passed into the region of the side flanks 10 of the carrier substrate 6 during the soldering of the optoelectronic component onto the conductor tracks 19 of the printed circuit board 18. To avoid such a short circuit, the side flanks 10 are provided with an electrically insulating layer 13 at least in the partial region 10a. Therefore, an electrically insulating layer 13 is applied not only to the main areas 11, 12 and the inner walls of the cutouts 8a, 8b of the carrier substrate 6, but also at least to a partial region 10a of the side flanks 10. The partial region 10a of the side flanks 10 to which the electrically insulating layer 13 is applied advantageously adjoins the second main area 12 of the carrier substrate 6 because the risk of a short circuit on account of a solder layer 20 possibly rising up to the side flanks 10 is greatest there.

The risk of a short circuit is lower if a partial region 10b of the side flanks 10 that adjoins the soldering connection 7 to the semiconductor body 1 is not covered by the insulating layer 13. A partial region 10b of the side flanks 10 that is not covered with the insulating layer 13 can arise, for example, because, during the production of the optoelectronic component, first, a multiplicity of semiconductor bodies 1 are connected to a semiconductor wafer composed of silicon that functions as a carrier substrate 6, and the semiconductor wafer is then subsequently singalated to form individual optoelectronic components. In this case, those partial regions 10b of the side flanks not covered by the insulating layer 13 are the regions at which the semiconductor wafer was separated. Those partial regions 10b of the side flanks 10 not covered with the insulating layer 13 therefore preferably run perpendicular to the first main area of the carrier substrate 6.

Application of the electrically insulating layer 13 to the partial regions 10a of the side flanks 10 and to the remaining regions of the carrier substrate 6 provided with the insulating layer 13 is preferably effected by a thermal oxidation and/or a coating method, wherein, in particular, a CVD method is suitable. The insulating layer 13 can be a silicon oxide layer, for example composed of $SiO_2$. A silicon oxide layer can he produced on a carrier substrate 6 composed of silicon advantageously by thermal oxidation. As an alternative, in particular, a silicon nitride layer is suitable, wherein the silicon nitride can have a stoichiometric or a non-stoichiometric composition $SiN_x$.

Those partial regions 10a of the side flanks 10 covered with the insulating layer 13 preferably run obliquely with respect to the main areas 11, 12 of the carrier substrate 6. In particular, the first partial regions 10a of the side flanks can extend at an obtuse angle α with respect to the second main area 12 of the carrier substrate 6. In this case, the obtuse angle α is preferably between 100° and 135° inclusive. Because the first partial regions 10a of the side flanks 10 extend obliquely with respect to the second main area of the carrier substrate 6, the coating of the partial regions 10a with the insulating layer 13 is facilitated. The coating can be effected, in particular, from the side at which the second main area 12 of the carrier substrate 6 is arranged, and can advantageously be carried out in particular in the wafer stage, that is to say before a semiconductor wafer used as a carrier substrate 6 is separated to form individual optoelectronic components. Since, in this case, the separation is only effected after the coating process, the second partial regions 10b of the side flanks 10, which serve as separation areas, remain uncoated.

Advantageously, the height of those partial regions 10a of the side flanks which are provided with the insulating layer is at least 30% of the total height of the carrier substrate 6. In this case, the height of the obliquely extending partial regions 10a of the side flanks should be understood to mean the projection onto the direction perpendicular to the main areas 11, 12 of the carrier substrate 6. In particular, the height of those partial regions 10a of the side flanks provided with the insulating layer can be 10% to 50% of the height of the carrier substrate 6. By way of example, the height of the partial regions 10a can he between 20 μm and 100 μm inclusive. The height of the carrier substrate 6 can be approximately 150 μm, for example.

To protect the active zone 4 of the optoelectronic component against excessively high reverse voltages as a result of electrostatic discharges, a doping zone 14 is formed in the carrier substrate 6, the doping zone forming a protective diode. The doping zone 14 has a p-doped region 14a and an n-doped region 14b, which adjoin one another and thus form a pn junction. The doping zone 14 is preferably arranged at the first main area 11 of the carrier substrate 6. Alternatively, it would also be possible to produce the doping zone 14 at the second main area 12 of the carrier substrate 6.

The p-doped region 14a and the n-doped region 14b of the doping zone 14 can be produced by ion implantation into the carrier substrate 6. If the carrier substrate 6 is a silicon substrate, by way of example, the p-doped partial region can he produced by implantation of B and the n-doped region can be produced by implantation of P.

The p-doped region 14a of the doping zone 14 is connected to the first electrically conductive connection layer 9a. The n-doped partial region 14b of the doping zone 14 is connected to the second electrically conductive connection layer 9b. The electrical connections are produced by virtue of the fact that one part of the solder layer 7, this part being connected to the first electrically conductive connection layer 9a, adjoins the p-doped partial region 14a and a further part of the solder layer 7, this further part being insulated from the first electrically conductive connection layer 9a by the insulating layer 23, is connected to the second electrically conductive connection layer 9b.

Because the first electrically conductive connection layer 9a is connected via the through contact 15 to the n-doped semiconductor region 5 and the second electrically conductive connection layer 9b is connected to the p-doped semiconductor region 3 of the optoelectronic component, the doping zone 14 forms a pn junction reverse-connected in parallel with the pn junction of the optoelectronic component. The pit junction formed by the doping zone 14 in the carrier substrate 6 is therefore forward-biased when, at the electrically conductive connection layers 9a, 9b, a voltage is present which is polarized in the reverse direction of the active layer 4 of the optoelectronic component. The doping zone 14 thus forms an ESD protective diode for the optoelectronic component Because the side flanks of the carrier substrate 6 composed of a semiconductor material are insulated and an ESD protective diode is integrated into the carrier substrate 6, the optoelectronic component is distinguished, in particular, by a lower sensitivity toward short circuits and electrostatic discharges ESD.

During a method for producing the optoelectronic component described herein, preferably a multiplicity of optoelectronic components are produced simultaneously on a semiconductor wafer functioning as a carrier substrate 6. In the intermediate step illustrated in FIG. 2A, a composite assembly composed of a semiconductor wafer serving as a carrier substrate 6 and a plurality of semiconductor bodies 1 has been produced. The details of the semiconductor bodies 1 and of the carrier substrate 6 correspond to the example illustrated in FIG. 1 and will therefore not be explained in greater detail again.

In the intermediate step illustrated in FIG. 2B, oblique side flanks have been produced in a first partial region 10a of the carrier substrate, the first partial region adjoining the second main area 12 of the carrier substrate 6. This can be effected, in particular, by producing V-shaped cutouts 25 at the locations of the second main area 12 of the carrier substrate 6 at which the carrier substrate 6 is later intended to be separated to form individual components. The V-shaped cutouts 25 therefore lie opposite the interspaces between the semiconductor bodies 1 in a vertical direction.

Figure 2C:
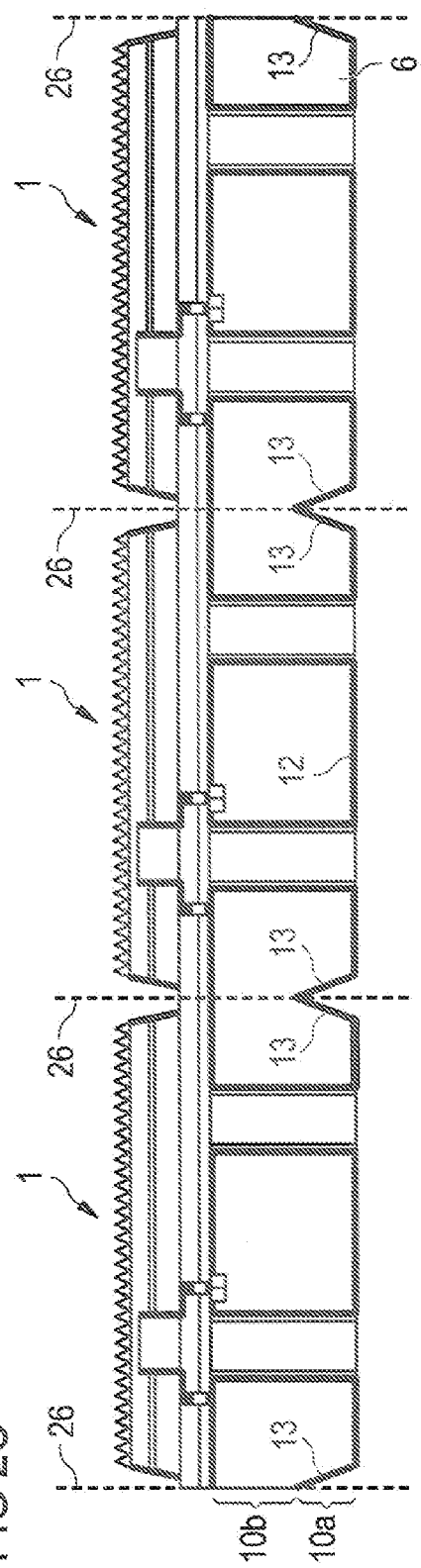

In the intermediate step illustrated in FIG. 2C, the V-shaped cutouts 25 have been provided with an electrically insulating coating 13. The coating process is advantageously effected while still in the wafer composite assembly, that is to say before the carrier substrate 6 is separated to form individual optoelectronic components. After application of the electrically insulating coating 13, the carrier substrate 6 is separated between the semiconductor bodies 1. This is symbolized in FIG. 2C by the dashed lines 26.

Figure 2D:
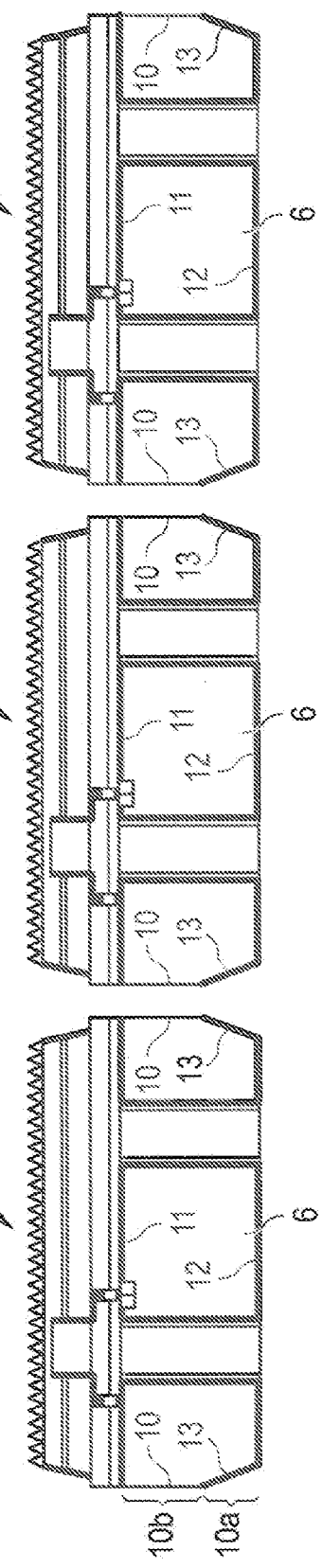

In this way, optoelectric components each having a semiconductor body 1 on a carrier substrate 6 are produced, as illustrated in FIG. 2D. The finished optoelectronic components each have a carrier substrate 6, the side flanks 10 of which, in a first partial region 10a, extend obliquely with respect to the main areas 11, 12 of the carrier substrate 6 and provided with an electrically insulating coating 13. The second partial regions 10b of the side flanks arose as a result of the separation of the carrier substrate 6 and are uncoated. The second partial regions 10b of the side flanks 10 preferably extend perpendicular to the second main area 12 of the carrier substrate 6.

This disclosure is not restricted by the description on the basis of the examples. Rather, the disclosure encompasses any novel feature and also any combination of features, which in particular includes any combination of features in the appended claims, even if the feature or the combination itself is not explicitly specified in the claims or examples.

The invention claimed is:

1. An optoelectronic component comprising a semiconductor body having an epitaxial layer sequence comprising an active layer that generates radiation, and a carrier substrate connected to the semiconductor body by a soldering connection, wherein the carrier substrate has a first cutout and a second cutout, through which a first electrically conductive connection layer and a second electrically conductive connection layer are led from a first main area of the carrier substrate, said first main area facing the semiconductor body, to a second main area of the carrier substrate, said second main area being remote from the semiconductor body, the carrier substrate comprises a semiconductor material, the carrier substrate has side flanks which, at least in a first partial region, extend obliquely with respect to the main areas of the carrier substrate, and the side flanks are provided with an electrically insulating layer in the first partial region.

2. The optoelectronic component according to claim 1, wherein the first partial region adjoins the second main area of the carrier substrate.

3. The optoelectronic component according to claim 1, wherein a height of the first partial region is between 10% to 50% of a height of the carrier substrate.

4. The optoelectronic component according to claim 1, wherein the first partial region of the side flanks has a height of 10 μm to 100 μm.

5. The optoelectronic component according to claim 1, wherein the carrier substrate is a silicon substrate.

6. The optoelectronic component according to claim 1, wherein the electrically insulating layer contains a silicon oxide or a silicon nitride.

7. The optoelectronic component according to claim 1, wherein the side flanks of the carrier substrate, in the first partial region, extend obliquely with respect to the main areas of the carrier substrate such that a cross section of the carrier substrate tapers toward the second main area.

8. The optoelectronic component according to claim 1, wherein the side flanks in the first partial region extend at an obtuse angle α of 100° to 135° with respect to the second main area of the carrier substrate.

9. The optoelectronic component according to claim 1, wherein the side flanks have a second partial region adjoining the first main area of the carrier substrate, said second partial region extending perpendicularly to the first main area.

10. The optoelectronic component according to claim 9, wherein the second partial region of the side flanks is not provided with an insulating layer.

11. The optoelectronic component according to claim 1, wherein the carrier substrate has, at the first or second main area, a doping zone that forms a protective diode between the electrically conductive connection layers.

12. The optoelectronic component according to claim 11, wherein the carrier substrate is undoped and the doping zone has a p-doped region and an n-doped region, wherein the first electrically conductive connection layer is electrically conductively connected to the p-doped region of the doping zone and the second electrically conductive connection layer is electrically conductively connected to the n-doped region of the doping zone.

13. The optoelectronic component according to claim 12, wherein the epitaxial layer sequence has a p-doped semiconductor region and an n-doped semiconductor region, the first electrically conductive connection layer is electrically conductively connected to the n-doped semiconductor region and the second electrically conductive connection layer is electrically conductively connected to the p-doped semiconductor region.

14. The optoelectronic component according to claim 11, wherein the doping zone is arranged at the first main area of the carrier substrate.

15. A method for producing an optoelectronic component according to claim 1, comprising:

producing a composite assembly composed of a plurality of semiconductor bodies and a semiconductor wafer functioning as a carrier substrate, producing the first partial region of the side flanks in the carrier substrate, wherein the side flanks, in the first partial region, extend obliquely with respect to the main areas of the carrier substrate, applying the electrically insulating layer to the side flanks in the first partial region, and separating the semiconductor wafer to form individual optoelectronic components, wherein the second region of the side flanks is formed during the separating process, said second region not being provided with an electrically insulating layer.

\* \* \* \* \*